US009936294B2

(12) United States Patent
Rabinowitz et al.

(10) Patent No.: US 9,936,294 B2
(45) **Date of Patent: *Apr. 3, 2018**

(54) AUTOMATIC AUDIO SYSTEM EQUALIZING

(71) Applicant: Bose Corporation, Framingham, MA (US)

(72) Inventors: William M. Rabinowitz, Bedford, MA (US); Hilmar Lehnert, Framingham, MA (US); Keith D. Martin, Westborough, MA (US); Richard Saffran, Southborough, MA (US); Abhijit Kulkarni, Thousand Oaks, CA (US); Finn A. Arnold, Sutton, MA (US)

(73) Assignee: Bose Corporation, Framingham, MA (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/009,987

(22) Filed: Jan. 29, 2016

(65) Prior Publication Data

US 2016/0198275 A1 Jul. 7, 2016

Related U.S. Application Data

(60) Continuation of application No. 13/295,129, filed on Nov. 14, 2011, which is a division of application No.
(Continued)

(51) Int. Cl.
*H04R 29/00* (2006.01)
*H04R 3/04* (2006.01)
(Continued)

(52) U.S. Cl.
CPC ................. *H04R 3/04* (2013.01); *H04R 3/12* (2013.01); *H04R 29/001* (2013.01);
(Continued)

(58) Field of Classification Search
CPC ......... H04R 29/00–29/008; H04R 3/04; H04R 2205/024; H04R 2430/01; H04S 7/301; H04S 7/307
See application file for complete search history.

(56) References Cited

U.S. PATENT DOCUMENTS 4,631,749 A 12/1986 Rapaich
5,018,205 A * 5/1991 Takagi .................... H03G 9/18
381/103
(Continued)

FOREIGN PATENT DOCUMENTS

JP H10-187164 A 7/1998
JP 2000354300 A 12/2000

OTHER PUBLICATIONS

Chinese Office Action dated Sep. 28, 2007 for Chinese Application No. 03107936.9.

*Primary Examiner* — Ping Lee

(57) ABSTRACT

An automated process for equalizing an audio system and an apparatus for implementing the process. An audio system includes a microphone unit, for receiving the sound waves radiated from a plurality of speakers, acoustic measuring circuitry, for calculating frequency response measurements; a memory, for storing characteristic data of the loudspeaker units and further for storing the frequency response measurements; and equalization calculation circuitry, for calculating an equalization pattern responsive to the digital data and responsive to the characteristic data of the plurality of loudspeaker units. Also described is an automated equalizing system including a acoustic measuring circuitry including a microphone for measuring frequency response at a plurality of locations; a memory, for storing the frequency responses at the plurality of locations; and equalization calculation circuitry, for calculating, from the frequency responses, an optimized equalization pattern.

24 Claims, 5 Drawing Sheets

Related U.S. Application Data

11/947,080, filed on Nov. 29, 2007, now Pat. No. 8,150,047, which is a division of application No. 10/105,206, filed on Mar. 25, 2002, now Pat. No. 7,483,540, said application No. 13/295,129 is a division of application No. 10/105,206.

(51) Int. Cl.
*H04R 3/12* (2006.01)
*H04S 7/00* (2006.01)

(52) U.S. Cl.
CPC .......... *H04R 29/002* (2013.01); *H04S 7/307* (2013.01); *H04R 2205/024* (2013.01); *H04R 2430/01* (2013.01); *H04S 7/301* (2013.01)

(56) References Cited

U.S. PATENT DOCUMENTS

| | | | | |
|---|---|---|---|---|
| 5,511,129 | A * | 4/1996 | Craven | H03G 5/165 381/103 |
| 5,729,612 | A * | 3/1998 | Abel | H04R 29/001 381/56 |
| 5,910,990 | A | 6/1999 | Jang | |
| 6,118,875 | A * | 9/2000 | M.o slashed.ller | H04S 1/005 381/1 |
| 7,058,190 | B1 * | 6/2006 | Zakarauskas | H04R 29/00 381/122 |
| 7,483,540 | B2 * | 1/2009 | Rabinowitz | H04S 7/307 381/103 |
| 8,150,047 | B2 * | 4/2012 | Rabinowitz | H04S 7/307 381/103 |
| 2002/0040254 | A1 | 4/2002 | Neoh | |
| 2002/0067835 | A1 | 6/2002 | Vatter | |
| 2002/0120193 | A1 | 8/2002 | Chiang et al. | |
| 2003/0027602 | A1 | 2/2003 | Han et al. | |

* cited by examiner

AUTOMATIC AUDIO SYSTEM EQUALIZING

CROSS-REFERENCE TO RELATED APPLICATIONS

This application is a continuation of U.S. patent application Ser. No. 13/295,129, filed on Nov. 14, 2011, which is a division of U.S. patent application Ser. No. 11/947,080, filed on Nov. 29, 2007, which is a division of U.S. patent application Ser. No. 10/105,206, filed on Mar. 25, 2002, the disclosures of which are incorporated herein by reference in their entirety.

BACKGROUND

The invention relates to equalizing system for audio systems, and more particularly to automated equalizing systems for audio systems.

It is an important object of the invention to provide an improved equalizing system for audio systems.

SUMMARY

According to the invention, an audio system includes a source of audio signals; signal processing circuitry coupled to the source for processing the audio signals to produce processed audio signals; a plurality of loudspeaker units, coupled to the signal processing circuitry, designed and constructed to be deployed about a room, for radiating sound waves responsive to the processed audio signals; a microphone unit, for receiving the sound waves and for transducing the sound waves to electrical signals; acoustic measuring circuitry, for receiving the transduced sound waves and calculating frequency response measurements; a memory, coupled to the acoustic measuring circuitry, for storing characteristic data of the loudspeaker units and further for storing the frequency response measurements; and equalization calculation circuitry, coupled to the memory, for calculating an equalization pattern responsive to the digital data and responsive to the characteristic data of the plurality of loudspeaker units.

In another aspect of the invention, an audio system, includes a source of audio signals; signal processing circuitry coupled to the source for processing the audio signals to produce processed audio signals; a plurality of loudspeaker units, coupled to the signal processing circuitry, designed and constructed to be deployed about a room, for radiating sound waves responsive to the processed audio signals; acoustic measuring circuitry, including a microphone, for receiving the sound waves and measuring frequency response at a plurality of locations; a memory, coupled to the acoustic measuring circuitry, for storing the frequency response at the plurality of locations; and equalization calculation circuitry, for calculating, from the frequency response, an optimized equalization pattern.

In another aspect of the invention, an audio system includes a source of audio signals, signal processing circuitry coupled to the source for processing the audio signals to produce processed audio signals, a plurality of loudspeaker units, coupled to the signal processing circuitry, designed and constructed to be deployed about a room, for radiating sound waves responsive to the processed audio signals. An equalizing system for the audio system includes acoustic measuring circuitry, including a microphone, for receiving and transducing the sound waves and for measuring frequency response at a plurality of locations; a memory, coupled to the acoustic measuring circuitry, for storing the frequency responses at the plurality of locations; and equalization calculation circuitry, for calculating, from the frequency responses, an optimized equalization pattern.

In another aspect of the invention, an audio system, includes a storage medium for storing digitally encoded information; signal processing circuitry coupled to the storage medium to produce audio signals; a plurality of loudspeaker units, coupled to the signal processing circuitry, designed and constructed to be deployed about a room, for radiating sound waves responsive to the audio signals; a microphone unit, for receiving the sound waves and transducing the sound waves to electrical signals; and a microprocessor electronically coupled to the storage medium and to the microphone, for developing an equalization pattern responsive to the electrical signals and to the computer instructions; wherein the digitally encoded information includes digitally encoded signals representing instructions to a user.

In another aspect of the invention, a process for generating an equalization pattern in an audio system having a first microphone and a loudspeaker unit, includes testing, by the audio system, the microphone to determine if the microphone is functional over a frequency range; and in the event the microphone is not functional over the frequency range, generating a message to a user.

In another aspect of the invention, a process for generating an equalization pattern in an audio system operating in a listening area, the listening area having an ambient noise level, the process includes radiating a sound at an amplitude into the listening area; measuring, by the audio system, the signal to noise ratio in the listening area; and in the event that the signal to noise ratio is below a threshold ratio, increasing the signal to noise ratio.

In another aspect of the invention, a process for generating an equalization pattern in an audio system having a loudspeaker device and a microphone, includes radiating, by the loudspeaker device a sound wave; receiving, by a microphone, the sound wave; measuring the amplitude of the received sound wave to determine if the amplitude is within a predetermined range of amplitudes; and in the event that the amplitude is not within the predetermined range of amplitudes, changing the amplitude so that the amplitude is within the predetermined range.

In another aspect of the invention, a process for generating an equalization pattern for an audio system having a loudspeaker device and a microphone, the audio system operating in a listening space, includes a first positioning the microphone at a first location; a first radiating, by the loudspeaker device, of a sound wave; a first receiving, by the microphone, of the sound wave; responsive to the receiving, a first measuring of a first frequency response of the audio system; a second positioning the microphone at a second location; a second radiating, by the loudspeaker device, a sound wave; a second receiving, by the microphone the sound wave; responsive to the second receiving, a second measuring of a second frequency response of the audio system; comparing the first frequency response with the second frequency response to determine the difference between the first frequency response and the second frequency response; and in the event that the difference is less than a predetermined amount, generating a message.

In another aspect of the invention, a process for generating an equalization pattern for an audio system having a loudspeaker device, includes storing in a memory operating limits of the loudspeaker device; generating an equalization pattern; comparing the equalization pattern with the operating characteristics to determine if execution of the equalization pattern could cause the limits to be exceeded; and in the event that the execution would cause the limits to be exceeded, modifying the equalization pattern.

In another aspect of the invention, an automated process for generating an equalization pattern for an audio system, includes an initiating step, executed by a user of the audio system; a responding to the initiating step, by the audio system, wherein the responding step is selected from a predetermined plurality of responses; and generating a message to the user by the audio system, the message directing the user to perform an action.

In still another aspect of the invention, a process for generating an equalization pattern from an audio system, includes an indicating, by a user, that the user is at an intended listening location; selecting, by the audio system, of a next step, wherein the next step is selected from a plurality of possible next steps; and generating by the audio system, a message to the user, the message including the next step to be taken by the user.

Other features, objects, and advantages will become apparent from the following detailed description, which refers to the following drawings in which:

DETAILED DESCRIPTION

Figure 1:
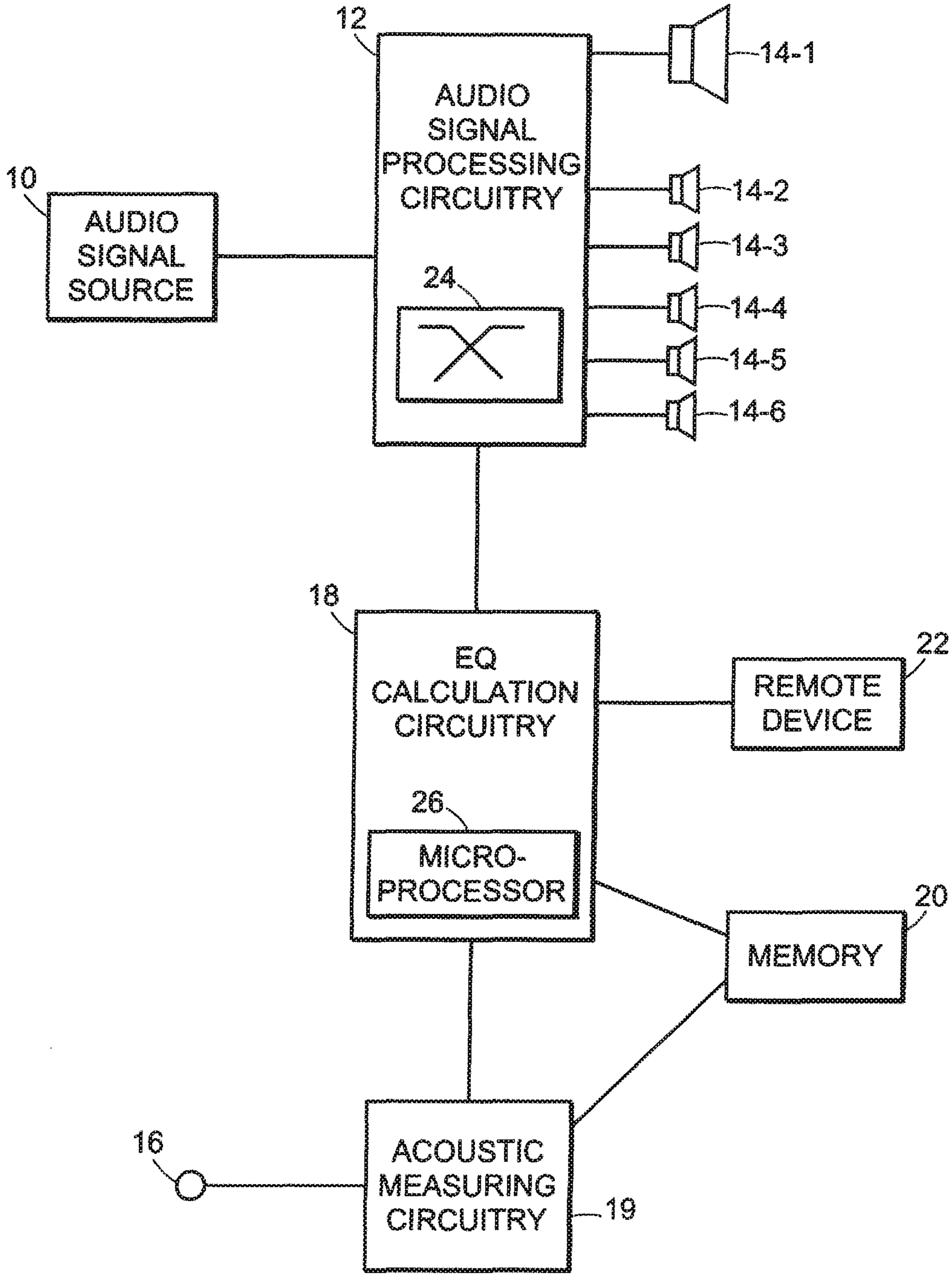
FIG. 1 is a block diagram of an audio system according to the invention.

With reference now to the drawings and more particularly to FIG. 1, there is shown a block diagram of an audio system according to the invention. Audio signal source 10 is coupled to audio signal processing circuitry 12 which may contain crossover circuit 24. Audio signal processing circuitry 12 is in turn coupled to loudspeaker units 14-1-14-6. Each of said loudspeaker units 14-1-14-6 includes one or more acoustic driver units, which transduce electrical signals (encoded in analog or digital form) into sound waves. Microphone device 16 is coupled to acoustic measuring circuitry 19, which is in turn coupled to equalization calculation circuitry 18 and to memory 20. Equalization calculation circuitry 18 may include microprocessor 26, and may be coupled to audio signal processing circuitry 12 and to signal source 10. Equalization calculation circuitry may also be coupled to memory 20 and may be coupled to an optional remote device 22.

Audio signal source 10 may be any of a variety of analog audio signal sources such as a radio, or, preferably, a digitally encoded audio signal source such as a CD player, a DVD or audio DVD player, or other source of digitally encoded audio signals, such as a "web radio" transmission or audio signals stored in digital form on a storage medium such as a compact disk, in random access memory, a computer hard disk or others. Audio signal processing circuitry 12 may include conventional audio signal processing elements (which can include both digital and analog components and digital to analog converters, amplifiers and others) to process the encoded audio signals which are then transduced into sound waves by loudspeaker units 14-1-14-6. Audio signal processing circuitry 12 may also include circuitry to decode the audio signals into multiple channels and also may include circuit elements, such as low latency infinite impulse response filters (IIRs) that can modify the frequency response of the audio system by implementing an equalization pattern developed by equalization calculation circuitry 18. Audio signal processing circuitry 12 may further include a crossover circuit 24 so that one of the loudspeaker units may be a subwoofer loudspeaker unit, while the other loudspeaker unit may be high frequency loudspeaker units. Alternatively, loudspeaker units 14-1-14-6 may be full range loudspeaker units, eliminating the need for crossover circuitry, or may include both low and high frequency acoustic drivers in which case the crossover circuitry may be in the loudspeaker units 14-1-14-6. In still another alternative, audio signal processing circuitry 12 and loudspeaker units 14-1-14-6 may both include crossover circuitry that has more than one crossover frequency. For simplicity of explanation, the invention is described with a subwoofer loudspeaker unit, a plurality of high frequency loudspeaker unit, with crossover circuit 24 in audio signal processing circuitry 12 having a single crossover frequency. Loudspeaker units 14-1-14-6 may include one or more acoustic drivers and may also include other acoustic elements such as ports, waveguides, acoustic masses, passive radiators, acoustic resistances and other acoustic elements. Microphone device 16 may be a conventional microphone adapted to be mounted to a headband or other body mount device as will be described below. Acoustic measuring circuitry may contain elements for receiving input from microphone 16 and measuring from the microphone input a frequency response. Equalization calculation circuitry 18 may include a microprocessor and other digital signal processing elements to receive digitized signals from microphone device 16 and develop a frequency response, compare the frequency response with a desired frequency response and other information as will be described later, and develop an equalization pattern that, combined with the frequency response detected by microphone device 16 causes loudspeaker units 14-1-14-6 to radiate a desired frequency response. The equalization pattern may be calculated by a software program running on a microprocessor 26. The software program may be stored in memory 20, may be loaded from a compact disk playing on digital audio signal source 20 implemented as a CD player, or may be transmitted from a remote device 22, which may be an internet link, a computer, a remote digital storage device, another audio device. Alternatively, the optional remote device 22 may be a computer running a software program and transmitting information to equalization calculation circuitry 18. Memory 20 may be conventional random access memory. The audio system of FIG. 1 may be a component of a home theatre system that includes a video device such as a television or a projector and screen.

In one operational method, a test audio signal may be played on audio signal source 10; alternatively, the source of the signal may be based on information stored in memory 20. Audio signal processing circuit 12 and loudspeaker units 14-1-14-6 transduce the test audio signal to sound waves which are radiated into the room about which and loudspeaker units 14-1-14-6 are placed, creating a frequency response resulting from the interaction of the room with the loudspeaker units. Sound waves are picked up by microphone device 16 and transmitted in electrical form to acoustic measuring device 19. Acoustic measuring device 19 measures the frequency response, and stores the frequency response in memory 20. Equalization calculation circuitry 18 calculates the equalization pattern appropriate to achieve a desired frequency response, and stores the calculated equalization pattern in memory 20. Thereafter, when the audio signal processing circuitry 12 receives an audio signal from audio signal source 10, the equalization pattern is transmitted to audio signal processing circuitry 12, which applies the equalization pattern to the audio signals transmitted to loudspeaker units 14-1-14-6 for transduction to sound waves. In some embodiments audio signal processing circuitry 12 may contain some elements, such as digital signal processing chips, in common with equalization calculation circuitry 18 and acoustic measuring circuitry 19. In another embodiment, portions of audio signal processing circuitry 12, acoustic measuring circuitry 19 and equalization calculation circuitry 18 may be in a so-called "head unit" (that is, the device that contains signal sources, such as a tuner, or CD player, or connections to external signal sources, or both), and on which the controls, such as source selection and volume are located, and other portions may be on one of the loudspeaker units 14-1-14-6 such as a subwoofer unit, or distributed among the loudspeaker units 14-1-14-6. This implementation facilitates a head unit that can be used with a variety of loudspeaker systems, while the portions of the audio signal processing circuitry 12 and equalization calculation circuitry 18 that are specific to the loudspeaker system are in one of the loudspeaker units.

Additionally, the audio system of FIG. 1 may be expanded to accommodate a second set of loudspeaker units (not shown) similar to loudspeaker units 14-1-14-6, placed in another listening space, such as another room. The operation described in the above paragraph can then be performed in the second listening space.

Other operational methods, in addition to the operational methods described above, may be employed. In one operational method, the test signals are not radiated from all the loudspeaker units at the same time, but rather are radiated from one loudspeaker unit at time, or from a selected set of loudspeaker units to enable the separate equalization of each loudspeaker unit or of selected sets of loudspeaker units.

In another alternate operational method, the equalization pattern is stored in the form of data describing digital filters which, when applied to the audio signal, result in the desired frequency response. The data may be in the form of filter singularities or filter coefficients.

Figure 2:
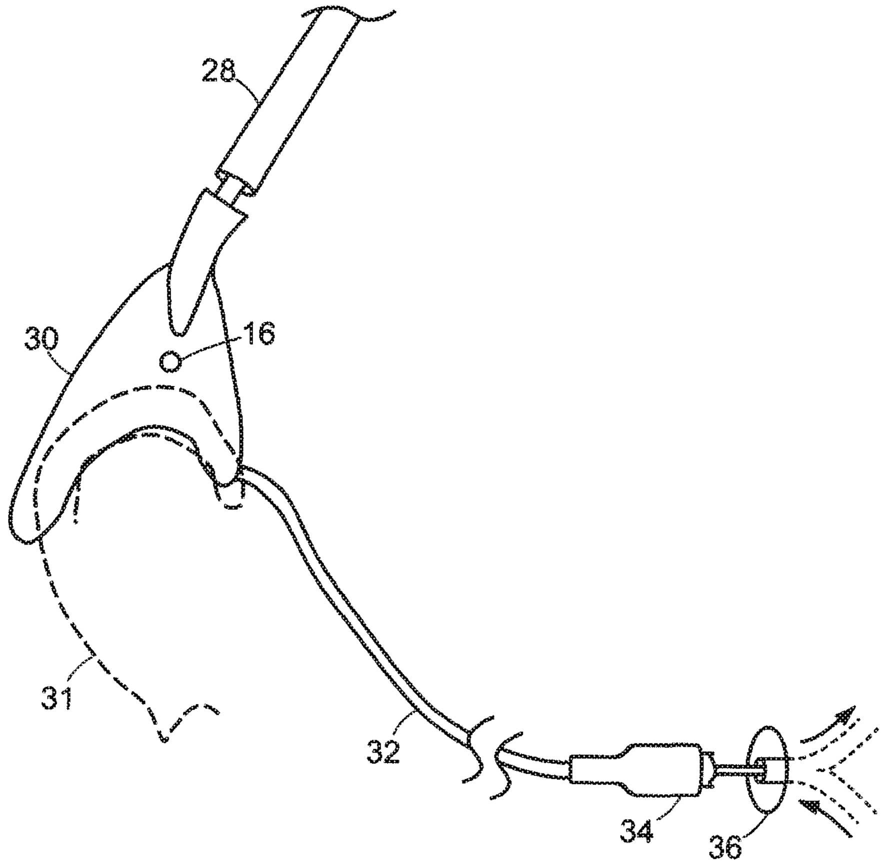
FIG. 2 is a diagram of a headphone for use with the invention.

Referring now to FIG. 2, there is shown a physical implementation of microphone device 16. Headband 28 is designed to fit on a user's head and may be adapted to hold an earpiece 30 near the ear 31 of a user. A microphone 16 may be mounted on earpiece 30. A similar microphone may be mounted on a second earpiece (not shown) positioned near another earpiece of the user. Microphone 16 device may be connected to terminal 34 by electrically conductive cord 32. Terminal 34 plugs into a jack 36 which may be a bi-directional jack. Bi-directional jack 36 is in turn coupled to equalization calculation 18 and to acoustic measuring circuitry 19, not shown in this view. In other implementations, a conventional headset may be included in earpiece 30 so that in addition to transmitting signals from the microphone device to acoustic measuring circuitry 19, the terminal 34 and electrically conductive cord 32 may transmit audio signals from audio signal processing circuitry 12 to earphones 30 in normal fashion. In other implementations, the microphone device may be implemented as one or more microphones mounted on some other portion of a headband, or on the user's body or on a stand. The jack may be adapted to fit into an auxiliary or special purpose jack and may be a one way input jack.

Figure 3:
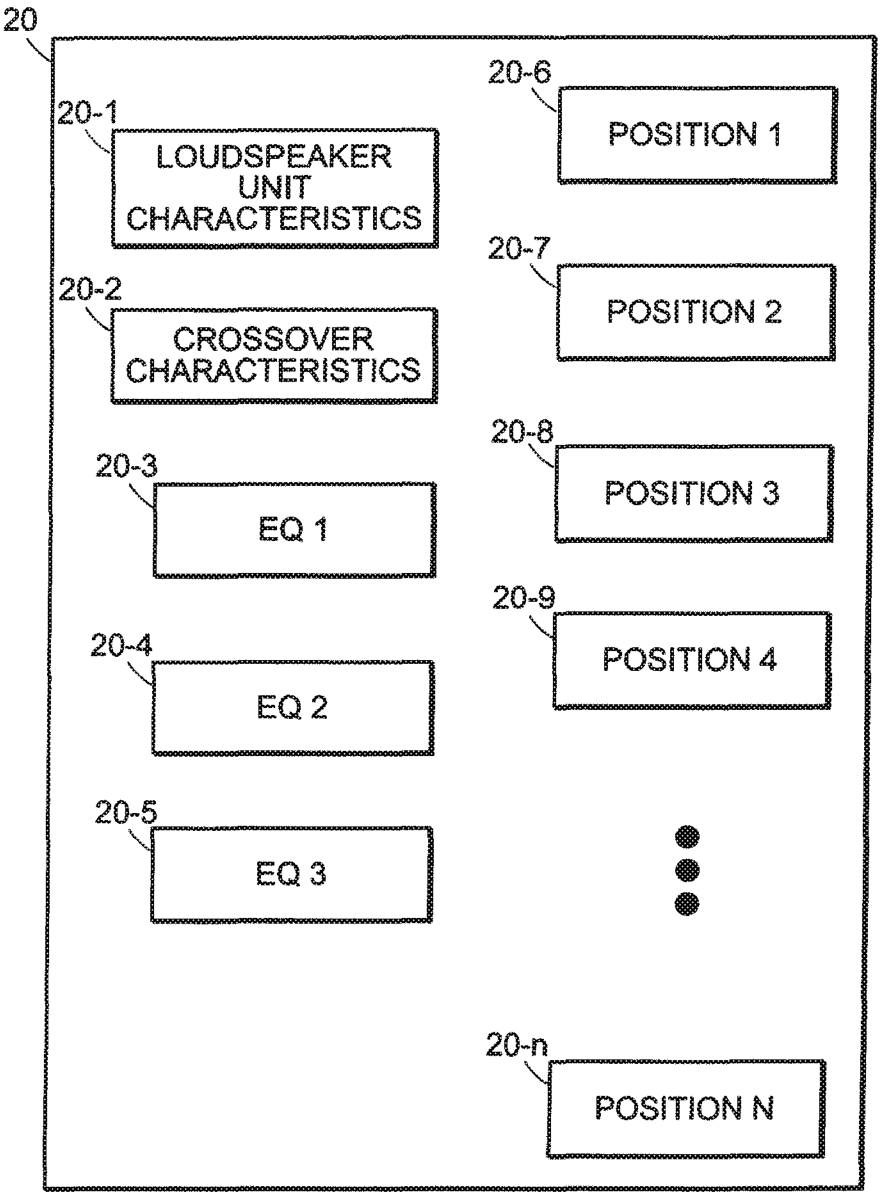
FIG. 3 is a diagram of a memory for use with the invention.

Referring to FIG. 3, there is shown a diagrammatic representation of memory 20. Stored in a first portion 20-1 of memory 20 may be data representing characteristics of loudspeaker units 14-1-14-6. Such data may include nominal sensitivity of the loudspeaker units in their main operational band, the bandwidth of the loudspeaker units, and excursion limits of the loudspeaker units and other information. Stored in a second portion 20-2 of memory 20 may be data representing characteristics of crossover circuit 24. Such data may include cutoff frequency and nominal fall off requirements. Stored in other portions 20-6 thorough **20-*n* of memory may be data from different listening positions, the reasons for which will be explained below. Stored in other portions 20-3, 20-4, and 20-5 of memory 20 may be equalization pattern 1, equalization pattern 2, and equalization pattern 3, respectively. Equalization pattern 1, equalization pattern 2, and equalization pattern 3 may represent different equalization patterns. The several equalization patterns may be equalization patterns that are calculated using a different desired target frequency response. The several equalization patterns may also represent different "modes," for example a "party mode" in which the equalization pattern in configured to provide a pleasing frequency response throughout the listening area, or a "sweet spot" mode, in which the equalization pattern in optimized for a specific listening position. As stated above in the discussion of FIG. 2**, the equalization patterns are stored in the form of data describing digital filters which, when applied to the audio signal, result in the desired frequency response. The data may be in the form of filter singularities or filter coefficients.

The data representing loudspeaker units in first portion 20-1 of memory is accessible to equalization calculation circuitry 18. An example of when such data may be useful to the equalization calculation circuitry 18 is when a calculated equalization pattern could compromise the performance of an acoustic drive unit by damaging the unit, or by causing distortion or clipping. Rather than compromising the performance of the acoustic drive unit the equalization pattern may be modified so that the frequency response is improved over the unequalized frequency response, but without overdriving the acoustic drive unit. Additionally, the loudspeaker unit data may be useful in assessing the integrity of the measurements. If a portion of the frequency response is below a threshold, the loudspeaker unit may not be operating properly. The data representing crossover characteristics in second portion 20-2 of memory is also accessible to equalization calculation circuitry 18. An example of the use of the data representing the characteristics of the crossover circuit may be when an equalization correction is necessary in the crossover band. The equalization pattern in a given frequency region that includes the crossover frequency region may be calculated such that the equalization correction is in the acoustic driver driven by the low pass section or the acoustic driver driven by the high pass section of the crossover band, or some combination of both, depending on the limitations of the drivers. Equalization patterns 1, 2, and 3 may be stored for later retrieval, for example, when the user desires to equalize to a different target frequency response or wishes to use a different mode as described above.

Figure 4:
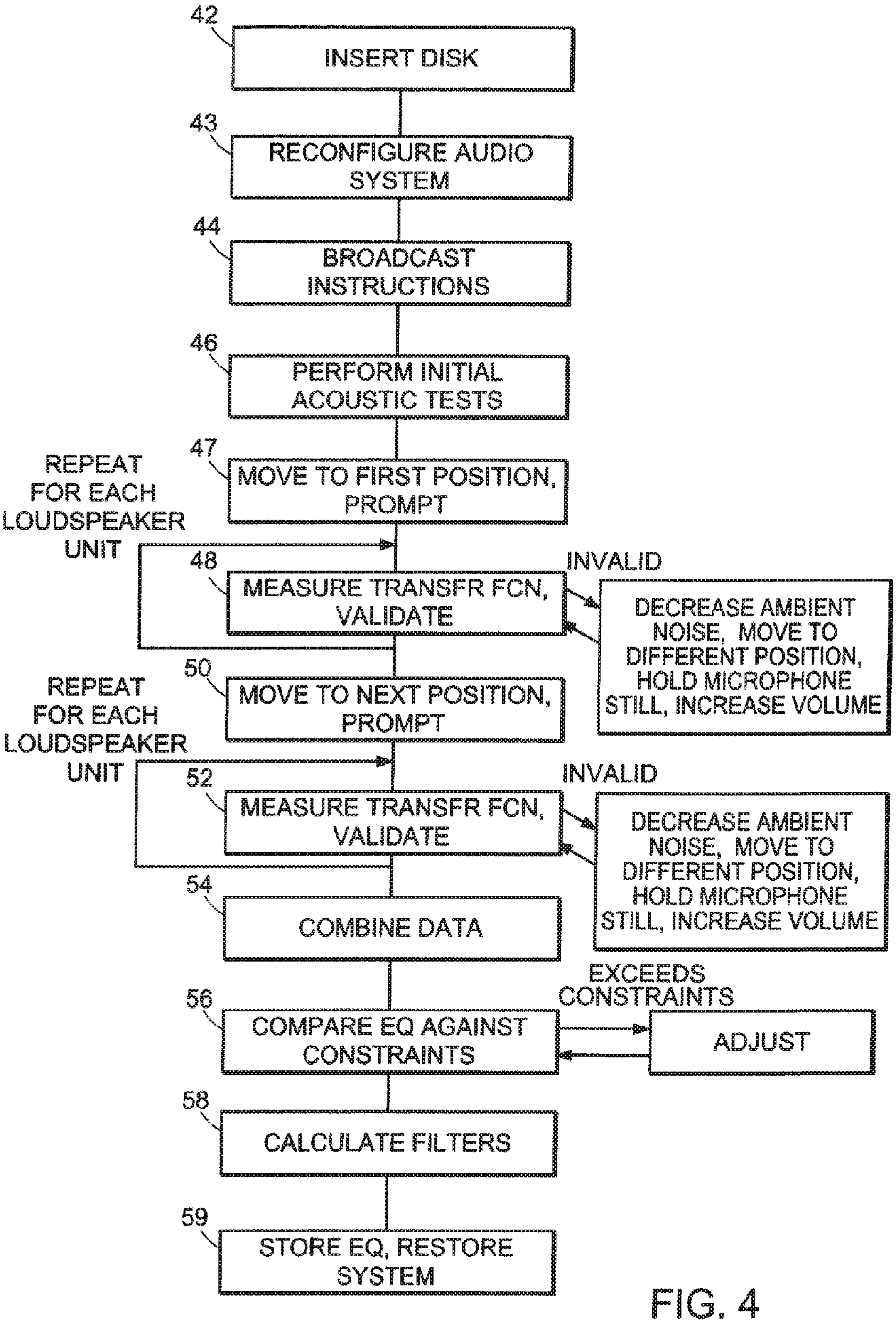
FIG. 4 is a flow diagram of a process for creating an equalization pattern according to the invention.

Referring to FIG. 4, there is shown a block diagram of a process for creating one or more equalization patterns according to the invention in an audio system in which the audio signal source 10 is adapted to transduce signals stored on a CD, DVD, audio DVD, or some other form of non-volatile memory. At step 42 the process is initiated. The initiation step may include initiating a software program stored in some non-volatile memory, which can me the same CD, DVD, audio DVD or non-volatile memory included by signal source 10. In one implementation, the process is initiated by the user inserting a disk into audio signal source 10. The disk has stored on it a software program which includes verbal instructions, video instructions, or some combination of audio and video instructions, to the user. Following the insertion of the disk into the audio signal source l0, the software program is executed by the microprocessor 26 or by the remote device 22. At step 43, the software program reconfigures the audio system, including controlling audio parameters, such as volume, and disabling tone controls, and any time varying, non-linear, or signal dependent signal processing. At step 44, the software program causes instructions to be communicated to the user. The instructions may be communicated to the user audibly (for example by broadcasting verbal instructions by at least one of the loudspeaker units 14-1-14-6 or through headphones), visually (for example by displaying words, or static or animated graphic figures on an attached video monitor, not shown), or by both verbal and visual means, which may be synchronized. The instructions may include a summary of the steps the user will be instructed to perform, as well as instructions to plug the terminal 34 into the bi-directional jack 36 or to some other input jack and to place the headband 28 on which microphones 16*a* and 16*b* are mounted, in place. The instructions may also include directions for the user to indicate when the user is ready to proceed, such as by pressing a button on the headband 28 or on a remote control unit, not shown. At step 46, the equalization circuitry performs initial acoustic tests, for example by determining if there is excessive ambient noise, and radiating a test signal and analyzing the result to ensure that both microphones are functional over the frequency band of interest and that the microphones are matched in sensitivity within a tolerance.

If the ambient noise is excessive, the user may be instructed to reduce the ambient noise. If the microphones are inoperative or not matched within a tolerance, the process may be terminated. At step 47, the user may then be instructed to move to a first desired listening location, and issue a prompt that the user is ready to proceed. At step 48, the transfer function (that is, the frequency response) at a first listening position are measured by acoustic measuring circuitry 19, and the measurements may be checked for validity, such as being within an appropriate range of amplitude, that the ambient noise is below a limit, and that the readings are within a range of coherency, stability over time, and repeatability (indicating that microphone does not move too much during the measurement). One test that can be used is to test for these conditions is a linearity test. A signal is radiated and the response measured. The signal is then radiated again, scaled down by some amount, such as −3 dB and the response measured and scaled up by +3 dB. The scaled up response to the second signal is then compared with the response to the first signal. A significant difference may indicate that the amplitude is not within an acceptable range, that the ambient noise is above a limit, or that the readings are not coherent, stable over time, or repeatable. If there is a significant difference between the scaled up response to the first signal and the response to the first signal, at step 49 verbal or visual instructions or both may be broadcast to the user to instruct the user to move to a location at which the sound is within the range of amplitude or to decrease the ambient noise level, by eliminating sources of ambient noise, or to hold the microphone more still while the measurements are being taken. However, if the signal to noise ratio is too low, the system may increase the volume so that the volume is within in a range of volumes, so that the signal to noise ratio is adequate, while minimizing the possibility of annoying the user or causing distortion or clipping of the radiated signal. While it is possible to measure a frequency response for the combined output of the speakers, it is generally more desirable to measure the frequency response (and thereafter calculate an equalization pattern) for each loudspeaker unit, rather than for the combined loudspeaker units.

While an equalization pattern may be calculated based on data from a single location, acquiring data from more than one location generally gives a better result. At step 52, the measurements and tests of step 48 may then be repeated for the second location, preferably for each loudspeaker unit. At the second location an additional test may also be performed, to determine whether the second location is too close to a previous location. One method of determining if a location is too close to a previous location is to compare the frequency response at the second location with the frequency responses at the previous location. If the any of the tests, including the "closeness" test, indicate an invalid measurement, at step 53, the user may be instructed to move or make a correction as in step 49. Steps 50, 52, and (if necessary) step 53 may then be repeated for more locations. If desired, a fixed number (such as five) of locations or a minimum number (such as four) of locations or a maximum number (for example eight) of locations may be specified. If measurements have not been taken at the minimum number of locations, the user may be instructed to move to another location. If measurements have been taken at the maximum number of locations (or if measurements have been taken at the minimum number and the user indicates that measurements have been taken at all desired locations), the process proceeds to step 54. At step 54, the data for all the positions may be combined by the acoustic measuring circuitry 19 (by some method such as energy averaging) and an equalization pattern developed from the data. At step 55, an equalization pattern is calculated. At step 56, the equalization pattern may be compared with the loudspeaker unit characteristics stored in memory 20 to ascertain that no limits (such as dB of correction) are exceeded, and the equalization pattern may be modified so that the limits are not exceeded. At step 58, the filters appropriate to achieve the equalization pattern are calculated and stored for use by audio signal processing circuitry 12. As stated previously, the filters may be stored in terms of filter coefficients or filter singularities.

A software program suitable for implementing the steps of FIG. 4 is included as supplementary disk A, which contains computer instructions which can be executed by a processor such as an ADSP-21065 processor, available commercially from Analog Devices Inc.

A process for creating an equalization pattern according to the invention is advantageous, because a non-expert, untrained user can perform acoustic measurements and create equalization patterns without the use of expensive measuring and calculating equipment. Additionally, the user can easily recalculate the equalization pattern for changes, such as moving the speakers, remodeling, replacing components and the like.

Figure 5:
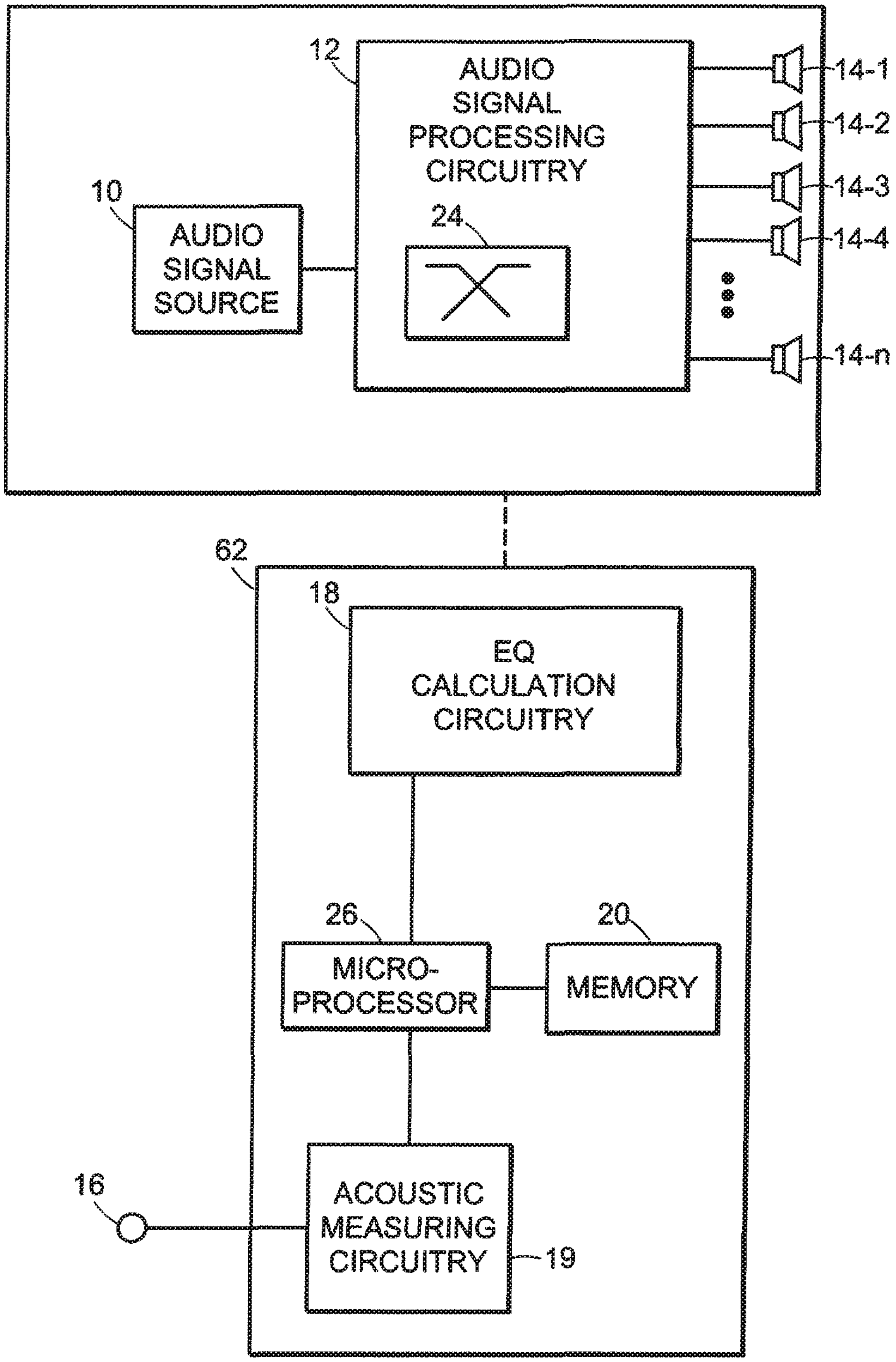
FIG. 5 is a block diagram of an alternate implementation of the invention.

Referring now to FIG. 5, there is shown another embodiment of the invention, particularly suitable for audio systems for business installations such as restaurants, retail stores and the like. Several of the elements are similar to like-numbered element of earlier FIG. 1. An audio system 60 includes an audio signal source 10. Audio signal source 10 is coupled to audio signal processing circuitry 12 which may contain crossover circuit 24. Audio signal processing circuitry 12 is in turn coupled to loudspeaker units 14-1-14-*n*. Each of said loudspeaker units 14-1-14-*n* includes one or more acoustic driver units, which transduce electrical or digital signals into sound waves. A portable computer device 62 includes a microphone device 16 coupled to acoustic measurement circuitry 19. Acoustic measurement circuitry 19 may be coupled to equalization calculation circuitry 18, which may be coupled to microprocessor 26. Microprocessor 26 is in turn coupled to memory 20. Audio system 60 and portable computer device 62 are adapted so that equalization patterns calculated by equalization calculation circuitry 18 can be downloaded to audio signal processing circuitry 12 as indicated by broken line 64.

Microphone device 16 may be a conventional microphone adapted to be attached to, or mounted on, a portable computer device. Acoustic measuring circuitry may include devices for measuring a frequency response. Equalization calculation circuitry 18 may include a microprocessor and processing elements to compare the measured frequency response with a desired frequency response and other information as will be described later, and develop an equalization pattern that, combined with the frequency response detected by microphone device 16 causes loudspeaker units 14-1-14-6 to radiate a desired frequency response. In one embodiment, equalization calculation circuitry 18 is implemented as a software program which run on microprocessor 26. The software program may be stored in memory 20, which may be conventional random access memory, or some other form of computer memory such as flash memory or ROM.

In operation, a test audio signal may be played on audio signal source 10. In one implementation, the test tone is recorded on a CD that has a continuous audio track with a 50% duty cycle of silence interspersed with bursts of test tones. In other implementations, the test tone may be stored in memory 20 or in some other component of portable computer device 62. Audio signal processing circuit 12 and loudspeaker units 14-1-14-6 transduce the test audio signal to sound waves which are radiated into the room about which and loudspeaker units 14-1-14-6 are placed, creating a frequency response resulting from the interaction of the room with the loudspeaker units. Microphone 16 is moved to an appropriate position in the room and triggered. Microphone device 16 transduces the next burst of the test tone and acoustic measurement circuitry 19 measures frequency response for that position. Microphone device 16 is then moved to a second position, and the transduction and frequency response calculation is repeated. After an appropriate number of measurements, a software program loaded into, or residing on, portable computer device 62, calculates an average room response from the position responses, and calculates an equalization pattern appropriate to achieve a desired frequency response, and stores the equalization pattern in memory 20. Thereafter, the equalization pattern is downloaded from portable computer device 62 to audio signal processing circuitry 12, which applies the equalization pattern to the audio signals transmitted to loudspeaker units 14-1-14-6 for transduction to sound waves.

In another implementation, rather than triggering the portable computer device 16 at each location, the portable computer device is moved about the room, and a frequency response is calculated for each tone burst. The frequency responses corresponding to each tone burst are continuously averaged to create the room frequency response.

In still another implementation, computer device 62 has stored on it a plurality of different selectable equalization targets corresponding to different listening conditions. Different listening conditions might include foreground music vs. background music; different types of music; noisy vs. quiet environments; different ambiances; and so forth. The equalization pattern calculated by equalization circuitry 18 will then be the difference between the room frequency response and the selected equalization target.

An audio system according to the embodiment of FIG. 5 is particularly advantageous for situations in which an audio system is designed and installed by a professional audio system designer for use in a commercial establishment, such as a restaurant, lounge, retail store, mall, and the like. For these situations, the audio system does not require a microphone or any equalization calculation circuitry. The equalization calculation circuitry and the microphone device may be included in a portable computer device 62 which can be used for a number of different installations.

Other embodiments are within the claims.

What is claimed is:

1. A process for generating audio parameters for an audio system having a loudspeaker and a microphone, said audio system operating in a listening space, said process comprising:

moving the microphone to different locations in the listening space;

receiving, by said microphone, sound waves radiated by the loudspeaker as the microphone is moved to different locations in the listening space;

responsive to said receiving, measuring a plurality of acoustic responses as the microphone is moved to different locations in the listening space;

performing a closeness test to determine if the acoustic responses were measured at locations that are too close together;

in the event that the closeness test determines that the acoustic responses were measured at locations that are too close together, generating a message;

combining the acoustic responses by a computer device to generate a combined acoustic response for the listening space;

comparing the combined acoustic response with a desired acoustic response;

determining the audio parameters; and using the audio parameters to cause the loudspeaker to radiate the desired acoustic response.

2. The process of claim 1, wherein the message instructs a user to move to a different location.

3. The process of claim 1, wherein the message is radiated as sound waves from the loudspeaker.

4. The process of claim 1, wherein the plurality of acoustic responses comprise a plurality of frequency responses.

5. The process of claim 1, wherein the closeness test comprises comparing a first one of the acoustic responses to a second one of the acoustic responses to determine a difference between the first one of the acoustic responses and the second one of the acoustic responses.

6. The process of claim 1, wherein the step of receiving sound waves comprises: receiving, by said microphone, sound waves radiated by the loudspeaker at each of the plurality of locations.

7. The process of claim 1, wherein the step of measuring a plurality of acoustic responses comprises: measuring a corresponding acoustic response for each of the plurality of locations.

8. The process of claim 1, wherein the step of receiving sound waves comprises receiving bursts of test tones from the loudspeaker, and wherein the step of measuring a plurality of acoustic responses comprises calculating an acoustic response for each tone burst.

9. The process of claim 8, wherein the step of measuring a plurality of acoustic responses comprises calculating a frequency response for each tone burst.

10. The process of claim 1, wherein the step of combining the acoustic responses comprises averaging the acoustic responses, such that the combined acoustic response is an average acoustic response for the listening space.

11. The process of claim 1, wherein determining the audio parameters comprises determining an equalization pattern that causes the loudspeaker to radiate the desired acoustic response.

12. The process of claim 1, wherein the audio parameters comprise data describing digital filters.

13. The process of claim 1, further comprising measuring, by the audio system, ambient noise in listening space; and determining if the ambient noise exceeds a predetermined threshold; and if the ambient noise exceeds the predetermined threshold, generating a message the instructs a user to reduce the ambient noise.

14. A process for generating audio parameters for an audio system having a loudspeaker and a microphone, said audio system operating in a listening space, said process comprising:

moving the microphone to different locations in the listening space;

receiving, by said microphone, sound waves radiated by the loudspeaker as the microphone is moved to different locations in the listening space;

responsive to said receiving, measuring a plurality of frequency responses as the microphone is moved to different locations in the listening space;

performing a closeness test to determine if the frequency responses were measured at locations that are too close together;

in the event that the closeness test determines that the frequency responses were measured at locations that are too close together, generating a message;

combining the frequency responses by a computer device to generate a combined frequency response for the listening space;

comparing the combined frequency response with a desired frequency response;

determining the audio parameters; and using the audio parameters to radiate the desired frequency response.

15. The process of claim 14, wherein the message instructs a user to move to a different location.

16. The process of claim 14, wherein the message is radiated as sound waves from the loudspeaker.

17. The process of claim 14, wherein the closeness test comprises comparing a first one of the frequency responses to a second one of the frequency responses to determine a difference between the first one of the frequency responses and the second one of the frequency responses.

18. The process of claim 14, wherein the step of receiving sound waves comprises: receiving, by said microphone, sound waves radiated by the loudspeaker at each of the plurality of locations.

19. The process of claim 14, wherein the step of measuring a plurality of frequency responses comprises: measuring a corresponding frequency response for each of the plurality of locations.

20. The process of claim 14, wherein the step of receiving sound waves comprises receiving bursts of test tones from the loudspeaker, and wherein the step of measuring a plurality of frequency responses comprises calculating a frequency response for each tone burst.

21. The process of claim 14, wherein the step of combining the frequency responses comprises averaging the frequency responses, such that the combined frequency response is an average frequency response for the listening space.

22. The process of claim 14, wherein determining the audio parameters comprises determining an equalization pattern that causes the loudspeaker to radiate the desired frequency response.

23. The process of claim 14, wherein the audio parameters comprise data describing digital filters.

24. The process of claim 14, further comprising measuring, by the audio system, ambient noise in listening space; and determining if the ambient noise exceeds a predetermined threshold; and if the ambient noise exceeds the predetermined threshold, generating a message the instructs a user to reduce the ambient noise.

* * * * *